United States Patent [19]

Simonnet

[11] Patent Number: 5,790,438

[45] Date of Patent: Aug. 4, 1998

[54] RADIO NAVIGATION TESTING METHOD AND DEVICE USING STANDARD SIGNAL MEASURING AND GENERATING EQUIPMENT

[75] Inventor: Jean-Paul Simonnet, Saint Genevieve Des Bois, France

[73] Assignee: Aerospatiale Societe Nationale Industrielle, Paris Cedex, France

[21] Appl. No.: 760,575

[22] Filed: Dec. 4, 1996

[30] Foreign Application Priority Data

Dec. 8, 1995 [FR] France ................... 95 14744

[51] Int. Cl.⁶ ........................................... G05B 23/02
[52] U.S. Cl. ................... 364/579; 364/481; 364/487; 342/165
[58] Field of Search ................... 364/579, 580, 364/480, 481, 484–487; 342/165, 169, 173, 174; 324/73.1; 455/226.1; 375/224–228; 370/242; 434/240–244

[56] References Cited

U.S. PATENT DOCUMENTS

| | | | |
|---|---|---|---|
| 4,311,466 | 1/1982 | Carpenter et al. | 434/242 |
| 4,641,254 | 2/1987 | Mitchell . | |
| 4,977,579 | 12/1990 | Bateman | 375/10 |
| 5,059,892 | 10/1991 | Stoft | 324/73.1 |
| 5,166,691 | 11/1992 | Chin et al. | 342/165 |
| 5,566,088 | 10/1996 | Herscher et al. | 364/579 |

FOREIGN PATENT DOCUMENTS

| | | |
|---|---|---|
| 0 052 671 | 6/1982 | European Pat. Off. . |
| 93/08483 | 4/1993 | WIPO . |

OTHER PUBLICATIONS

Firmenschrift No: 214311 Rhode & Schwarz, Munchen, pp. 1–8, "Test assembly for air navigation and communication receivers." Date Unknown.

Navy Technical Disclosure Bulletin, vol. 8, No. 3, pp. 23–26 (1983). Orme D.D. et al., "IFF Simulator."

Proceedings of Southeastcon, vol. 1, pp. 401–404 (1991). Judge, D., "Trends in automatic testing of electronic devices."

Primary Examiner—James P. Trammell
Attorney, Agent, or Firm—Browdy and Neimark

[57] ABSTRACT

For the testing of radio navigation instruments by means of an automatic testing system controlling electric signal measuring and generating equipment, said instruments using radio navigation signals comprised of complex-shaped composite low-frequency signals modulating a high-frequency carrier wave, the method embodying the invention comprises the utilisation of standard signal generating equipment (11, 13, 14, 15) to generate primary low-frequency signals and a high-frequency carrier wave, the combining of these primary signals to obtain said composite low-frequency signals, and the modulation of the high-frequency carrier wave by the composite signals.

14 Claims, 3 Drawing Sheets

RADIO NAVIGATION TESTING METHOD AND DEVICE USING STANDARD SIGNAL MEASURING AND GENERATING EQUIPMENT

BACKGROUND OF THE INVENTION

1. Field of the Invention

This invention relates to a method and device for testing radio navigation instruments.

It applies notably, though not exclusively, to the automatic testing systems used to test the radio navigation instruments used on board aerodynes. Such systems usually comprise a computer designed to be able to automatically perform test sequences during which signal measuring and generating equipment is controlled by the computer with a view to applying stimuli to the equipment to be tested and to measuring the effects thereof.

2. Description of the Prior Art

When testing radio navigation instruments, it is necessary to be able to generate and analyze signals of complex shape processed and/or generated by these instruments.

Furthermore, there are many different radio navigation systems such as:

- VOR (Visual Omnidirectional Range),
- ILS (Instrument Landing System),
- TACAN (Tactical Air Navigation),
- IFF (Identification Friend and Foe),
- DME (Distance Measurement Equipment),
- GPS (Global Positioning System),
- radar systems,
- radalts.

All these systems use signals of complex shape specific to the system, these shapes being defined by precise and separate standards.

In order to test radio navigation instruments, it has therefore been necessary to develop as many types of signal generating and measuring equipment as there are types of radio navigation signals.

It so happens that this solution is both costly and cumbersome. Certain manufacturers have therefore designed devices capable of generating several types of signals, based on the observation according to which radio navigation systems conjugate signals in the low-frequency range with signals in the high-frequency range. However, these two ranges can be dissociated as there is no interaction between them. In fact, the useful signal is a simple low-frequency signal, such as e.g. a string of pulses such as those used in the DME and IFF systems, or a composite low-frequency signal like the frequency modulation used in the VOR system. All the operations performed on the low-frequency signals nonetheless remain simple and are limited to combinations of modulations and additions.

However, such equipment is still limited to one or two types of radio navigation signal.

OBJECT OF THE INVENTION

The main object of this invention is to remedy the preceding disadvantages, particularly to provide a method for testing radio navigation instruments using an automatic testing system controlling electric signal measuring and generating equipment, said instruments using complex-shaped composite low-frequency signals which modulate a high-frequency carrier wave.

This method is characterized in that it comprises the utilisation of standard signal generating equipment to generate primary low-frequency signals and a high-frequency carrier wave, the combining of these primary signals to obtain said composite low-frequency signals, the modulating of the high-frequency carrier wave by composite signals, and the utilisation of standard signal measuring and analysis equipment.

SUMMARY OF THE INVENTION

Accordingly, based on the concept of virtual instrumentation, this solution enables, by way of the embodiment into one single device of simple design, the generation of all the signals of which synthesis is required.

Compared with the solution consisting in producing as many items of signal generating equipment as there are radio navigation signal types to be generated, useless duplication of the basic signal synthesis functions is thus avoided and the basic signal generating equipment remains available for other uses.

This solution also avoids the need for a control interface per type of signal to be generated.

The invention also relates to a device for testing radio navigation instruments, this device being connected to standard signal generating and measuring equipment, and comprising a means for generating a composite low-frequency signal by combination of primary low-frequency signals coming from said standard equipment, as well as a means for modulating a high-frequency carrier wave coming from said standard equipment, by means of the composite low-frequency signal.

BRIEF DESCRIPTION OF THE DRAWINGS

Further features and advantages of the invention will be apparent from an embodiment of the method and device according to the invention described, by way of a non-limiting example, in reference to the corresponding accompanying drawings in which.

DESCRIPTION OF THE PREFERRED EMBODIMENTS

Figure 1:
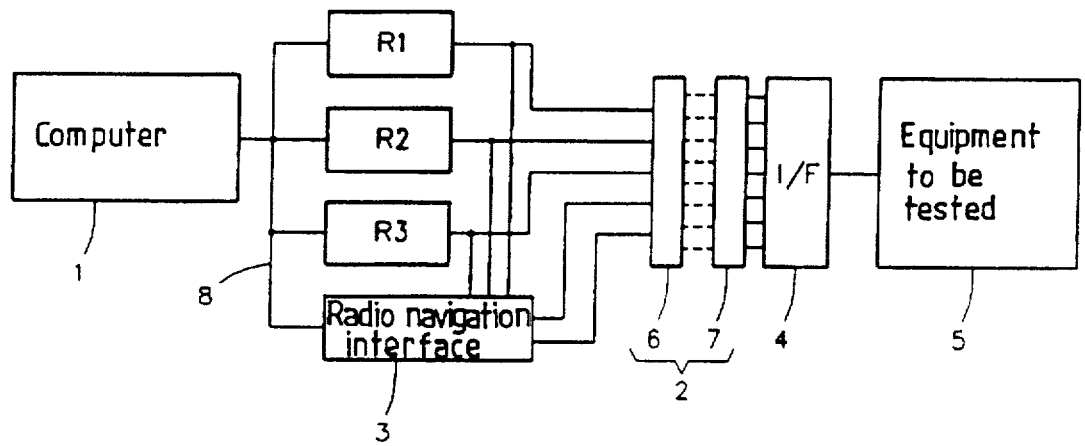
FIG. 1 is a schematic representation of an automatic testing system comprising a device for generating and measuring radio navigation signals according to the invention.

FIG. 1 shows an automatic testing system comprising a computer 1 connected, via a bus 8, to a plurality of test resources R1,R2,R3 such as signal measuring and generating equipment. This computer 1 is capable of automatically performing an automatic testing sequence and of driving the different test resources R1,R2,R3 connected to the bus 8. The input and output signals of these test resources are applied to the equipment to be tested S via a connector 2 comprising two connection members 6,7 (plug and socket), and a test interface 4.

In addition, in order to generate and analyze signals of complex shape such as radio navigation signals like those used in aviation, this testing system comprises a radio navigation interfacing device 3 embodying the invention connected to the bus 8 so as to be capable of being driven by the computer 1, and connected to the inputs and outputs of the test resources R1,R2,R3 and to the connector 2.

Figure 2:
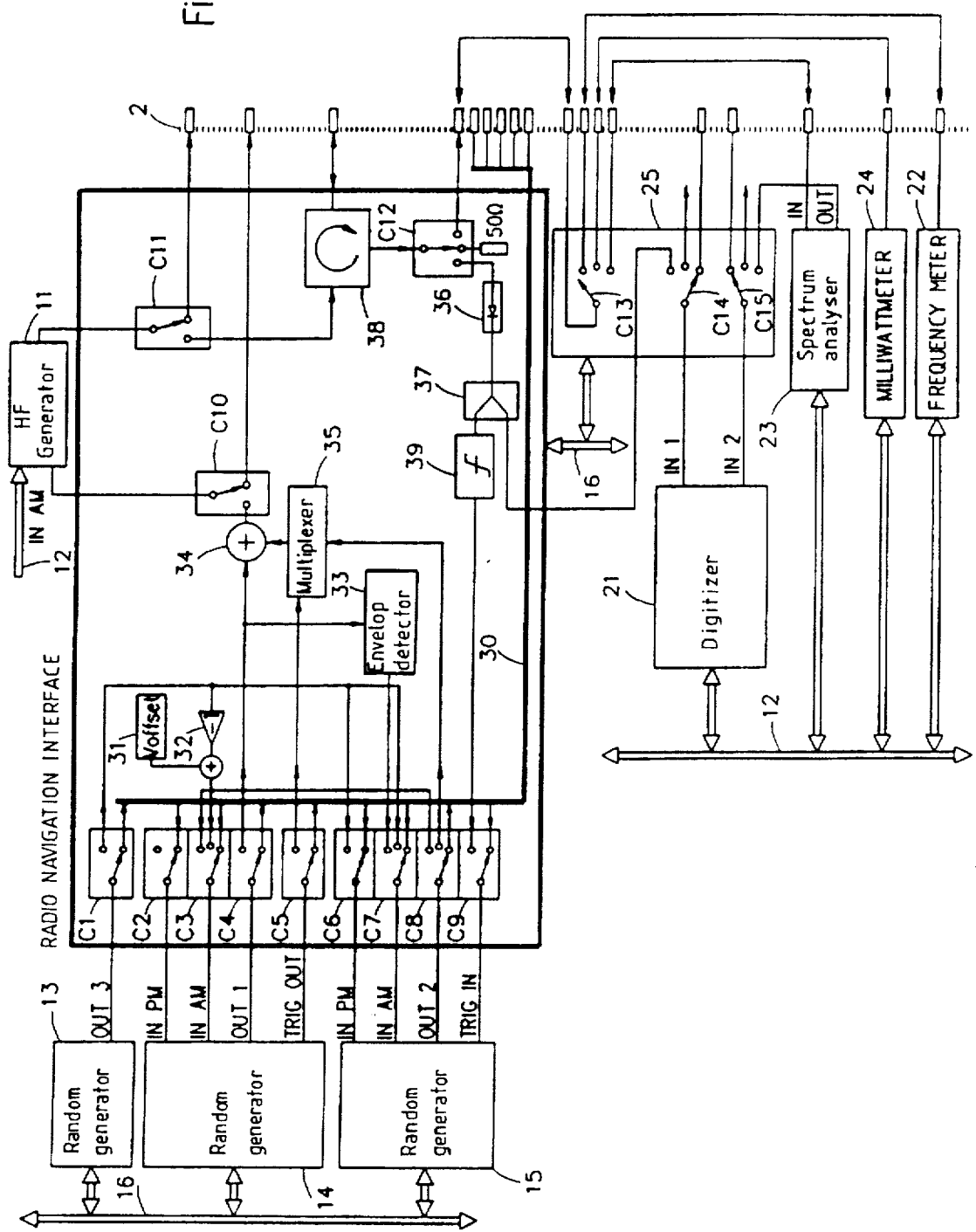
FIG. 2 is a diagram of the hardware architecture of the device embodying the invention.

Thus, in FIG. 2, the radio navigation interfacing device 3 is connected to a set of signal generators, such as a high-frequency signal generator 11, and three random generators 13,14,15.

The HF generator 11 must be a wideband generator (above 30 MHz) at its amplitude modulation input in order to be capable of supplying all the carrier waves used in the field of radio navigation, and of modulating the amplitude thereof.

The random generators are programmed point by point, thus enabling almost all signal waveshapes to be obtained. To this end, they can be programmed by inserting a string of points of a certain length and sampling step value (e.g. 40 ns). This string of points can be repeated indefinitely or for a certain number of cycles as a function of an operating mode to be selected.

To be capable of analyzing the signals supplied by the equipment to be tested 5, the interfacing device 3 is connected to measuring equipment such as a digitizer 21, a frequency meter 22, a milliwattmeter 24 and a spectrum analyzer 23. Also used is a switching device 25 enabling the different signals from the test resources and testing interface 4 to be oriented or combined.

This signal measuring and generating equipment and the radio navigation interfacing device 3 are controlled by the computer 1. To this end, they are connected to the computer 1 via digital data transmission busses, such as IEEE 12 for the HF generator 11 and the measuring instruments 21 to 24, and VXI 16 for the random generators 13 to 15 and the interfacing device 3.

The interfacing device 3 comprises a set of switches C1 to C11 controlled via the VXI bus 16 and whose home position enables the switch input to be connected to the connector 2 via a local bus 30.

The two-position switch C1 is connected at its input to the output of the random generator 13. Furthermore, in the active position of this switch C1 the output is connected, on the one hand, to the respective inputs of the phase and amplitude modulation signal of the random generator 15 respectively via switches C6,C7, and, on the other hand, to the amplitude modulation input of the random generator 14 via a reversing switch 32 and the switch C3.

In the active position, the two-position switch C2 enables deconnection of the phase modulaton input of the random generator 14 from the local bus 30.

In the active position, the three-position switch C3 enables the application, to the amplitude modulation input of the random generator 14, either of the output signal of the reversing switch 32 to which is added an offset voltage 31 of programmable value, or of the output of the random generator 15 via the switch C8.

In the active position, the two-position switch C4 enables the output of the random generator 14 to be oriented towards the input of an adder 34 and envelop detector 33, whereas the two-position switch C5 enables the triggering output of the random generator 14 to be applied to the control input of an analog multiplexer 35.

In the active position, the two-position switch C6 connects the phase modulation input of the random generator 15 to the switch C1.

In the active position, the three-position switch C7 also enables the output of the envelop detector 33 to be connected to the amplitude modulation input of the random generator 15.

In the active position, the three-position switch C8 also enables the output of the random generator 15 to be applied to the input of the analog multiplexer 35 of which the output is connected to the input of the adder 34.

In the active position, the two-position switch C9 enables the signal supplied by a threshold detector 39 to be applied to the triggering input of the random generator 15.

The switch C10 enables the amplitude modulation input of the HF generator 11, in the active position, to be connected to the output of the adder 34, and, in the home position, to be connected directly to the connector 2.

The switch C11 enables the output of the HF generator 11 to be oriented either directly to the connector 2 when in the home position, or, in the active position, towards the transmission input of a circulator 38 of which the transmission/reception input/output is connected to the connector 2 and of which the reception output is connected to a switch C12.

The switch C12 enables the signal at input to be directed either towards the connector 2, or towards the ground with an impedance of 50 Ω enabling reflection of the signal towards the source to be avoided, or to a detector 36 which enables the HF signal to be demodulated and of which the output is applied to the input of a power divider 37 enabling the signal to be transmitted along two lines while complying with the respective impedances of the latter.

The power divider 37 is connected at output to the threshold detector 39 and to the switching device 25 of the testing system.

The switching device 25 comprises a set of switches C13,C14,C15 with several positions, controlled by the computer 1 by means of the VXI bus 16, the switch C13 enabling, in the home position, its inputs to be isolated from the connector 2, whereas the respective inputs of the switches C14 and C15 in the home position are connected to the connector 2.

The terminals of the switch C13 are connected to respective pins of the connector 2, whereas the switch C14 in the active position applies, to the first input of the digitizer 21, either an internal signal of the equipment to be tested or the output of the power divider 37.

In the active position, the switch C15 applies, to the second input of the digitizer 21, either another internal signal of the equipment to be tested, or the intermediate frequency output IF of the spectrum analyzer 23.

Furthermore, the inputs of the spectrum analyzer 23, frequency meter 22 and milliwattmeter 24 are connected to respective pins of the connector 2.

Figure 4:
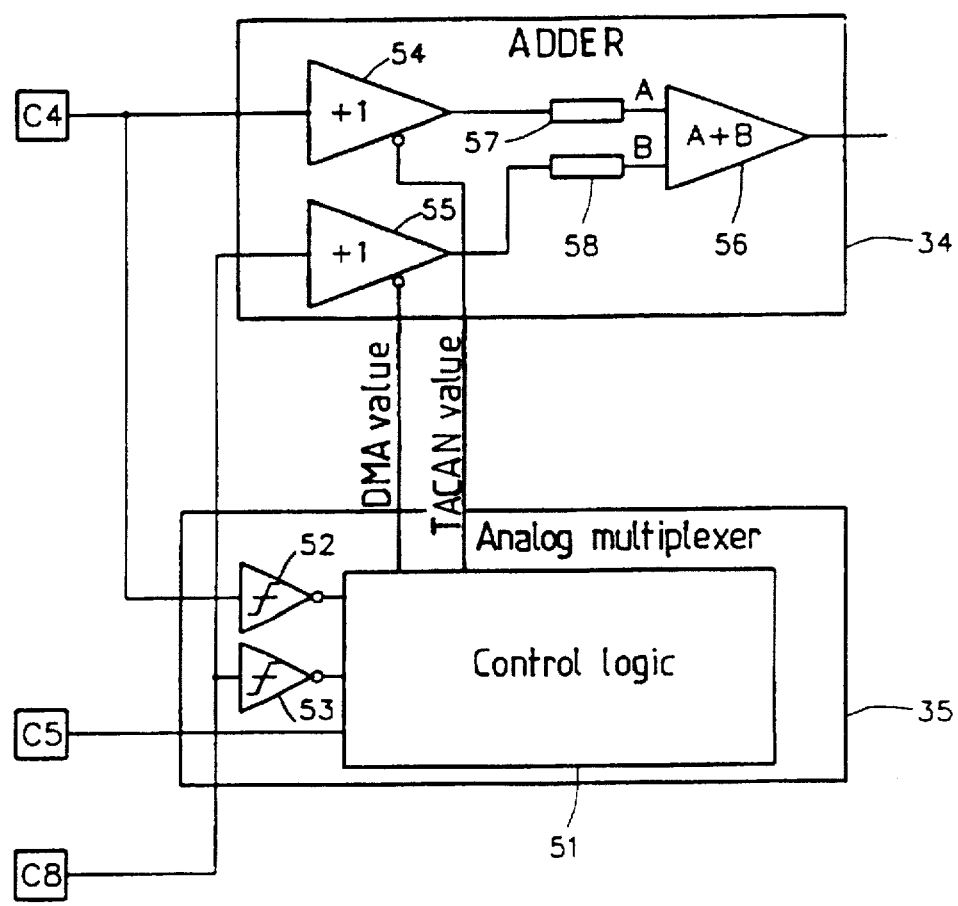
FIG. 4 is a detailed representation of one part of the device according to the invention.

FIG. 4 shows details of the adder 34 and analog multiplexer 35. In this FIG., the adder 34 comprises two inputs connected respectively to the switches C4 and C8, these inputs being applied to two signal adapters 54,55 of which the outputs are connected to the inputs of the adder proper 56 via resistors 57,58 setting its gain.

The analog multiplexer 35 comprises a control logic 51 with three inputs, i.e. two inputs connected respectively to the switches C4 and C8 via reversing hysteresis detectors 52,53 and one input connected to the switch C5.

The control logic 51 comprises two outputs connected respectively to the control inputs of the two signal adapters 54,55 of the adder 34.

The control logic 51 can be manufactured from programmable components, e.g. of the PAL or EPLD type. It is programmably set up via the VXI bus 16.

Figure 3:
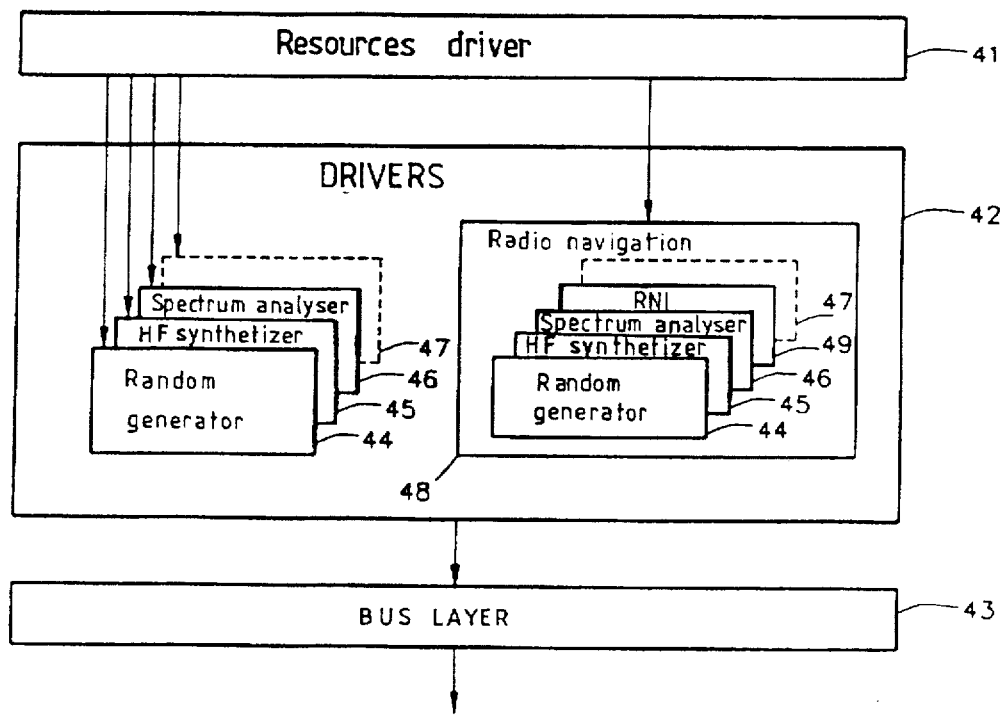
FIG. 3 is a representation of the software architecture of the control computer of the device embodying the invention and of the signal generating and measuring equipment.

The computer 1 is designed to be able to automatically perform test sequences defined by means of a high-level programming language. To this end, it comprises a software programme of which the architecture is represented in FIG. 3. This software comprises a first test resource driving layer 41 capable of performing a test sequence comprising instructions of a high level of control of the different items of signal generating and measuring equipment and of the switching devices enabling the establishing of the connections required to set up the test sequence, between the equipment and the different test points of the equipment to be tested, led back to the testing interface 4.

This software comprises a so-called drivers layer 42 comprising all the respective drivers 44 to 48 of the equipment used, each driver containing the translation, into low-level control language specific to the item of equipment, of the high-level instructions enabling a test sequence to be defined. This drivers layer 42 comprises, in particular, the driver 48 for the radio navigation interfacing device 3 which includes the drivers for the equipment 11,13,14,15 and 21 to 25 used by the device 3.

This software also comprises a bus layer 43 which enables the different low-level orders determined by the drivers layer 42, from the high-level orders, to be transmitted on the different IEEE bus 12 and VXI bus 16 as a function of the location of the equipment to which these orders are addressed.

Thus, the driver 48 for the radio navigation interfacing device 3 is capable of translating a radio navigation signal generation order, indicating no more than the type of signal and the different parameters defining this signal, into a series of elementary orders defining the operating parameters of the device 3 and of each item of signal generating equipment 11,13,14,15 to be used.

The description hereinunder discloses how the interfacing device 3 described above can synthesize and enable the analysis of radio navigation signals, such as VOR, ILS, DME, TACAN and IFF signals.

VOR signals

In the case of a VOR signal determining the angle between the magnetic north and the axis passing through the signal receiver and the transmitting marker, this involves synthesizing a low-frequency signal transmitted in amplitude modulation on the VHF band between 108 and 111 MHz, and having the following mathematical equation:

$$VOR(t) = K \cos(\omega t - \phi)] + K \cos((332\omega t - m \sin(\omega t)) + 0.5 \, K \cos(34 \, \omega t)$$

where m is the nominal modulation index 16,
K is the 30% modulation amplitude,
ω is the pulse at 30 Hz,
φ is the phase shift between the reference signal and the azimuth signal.

The last term corresponds to the modulating to 1020 Hz of the VOR marker identification signal.

The VOR(t) signal is, in fact, characterized by a carrier wave modulated by a 9960 Hz signal which is phase and amplitude modulated by a 30 Hz signal.

To synthesize the VOR(t) signal in the static mode, the random generator 14 is used to generate the low-frequency signal and the HF generator 11 is used to generate the carrier wave in the VHF band modulated by the low-frequency signal.

To generate such a signal in the absence of the marker identification signal, the random generator 14 needs only to be programmed to obtain the waveshape defined by the following relation:

$$K \cos(\omega t - \phi)] + K \cos(332 \, \omega t - m \sin(\omega t))$$

To do so, the signal must be sampled at a frequency corresponding e.g. to 10 samplings per period of the basic signal, i.e. 10×9960 Hz, with a number of samplings equal to the sampling frequency divided by 30 Hz, i.e. 3320 samplings, the amplitude of each sample being given by the relation above.

This waveshape can advantageously be loaded beforehand in the memory of the random generator 14.

When the marker identification signal is present, the same sampling frequency and the same number of previously loaded samples are used, and the following term is simply added to the previous relation in order to compute the value of each of the samples:

$$0.5K \cos(34 \, \omega t)$$

After that, all that is needed is to command the HF generator 11 to generate a carrier wave at the required VHF frequency, and the radio navigation interfacing device 3, by means of the switches C4 and C10, so that the output signal of the generator 14 modulates the carrier wave generated by the HF generator 11, the switch C11 enabling the output of the HF generator 11 to be applied to the connector 2.

In the dynamic mode, this involves simulating the signal received by an aircraft approaching a VOR marker. In this context, the on-board equipment receives a carrier wave modulated by a 9960 Hz signal which is itself amplitude and phase modulated by a 30 Hz signal of phase variable between the 30 Hz of the phase modulation and the 30 Hz of the amplitude modulation. The phase deviation between these two signals enables the on-board equipment to deduce its direction in relation to the magnetic north.

To synthesize such a modulating signal, three random generators 13 to 15 are used, i.e.

the generator 14 which generates the 9960 Hz signal phase modulated by a 30 Hz signal with a modulation index of 16, the generator 15 which generates the 30 Hz signal used to amplitude modulate the signal supplied by the generator 14, and the generator 13 which generates the signal modulating the phase of the signal supplied by the generator 15.

The device 3 enables the generators to be wrapped around as set forth above, as well as enabling transmission of the resultant signal to the amplitude modulation input of the HF generator 11 which supplies, in accordance with the programming parameters, the amplitude modulated HF signal to the connector 2. To this end, the switches C1 to C7 are tripped to apply the output of the generator 13 to the amplitude modulation input of the generator 15, the switches C8 and C3 are controlled so as to apply the output of the generator 15 to the amplitude modulation input of the generator 14, and the switches C4 and C10 are tripped to transmit the output of the generator 14 to the amplitude modulation input of the HF generator 11.

ILS signals

ILS signals are used for landing of aircraft and comprise, in fact, three types of signals for three separate functions:

a LOCALIZER function which ensures lateral guidance in relation to the axis of the runway, a GLIDE function which provides vertical information in relation to a given slope, and a MARKER function which indicates, in auditive and visual form, the distance of the aircraft, at three points, from the runway threshold.

The LOCALIZER function uses a composite low-frequency signal conveying information on alignment in relation to the axis of the runway, this signal performing amplitude modulation of the HF carrier wave.

This signal comprises two components respectively at 90 Hz and 150 Hz and on which a 1020 Hz identification signal can be superposed, and is transmitted in VHF on the band included between 108.1 and 111.9 MHz.

The alignment information is provided by the predominance of one or other of the 90 Hz and 150 Hz components.

The equation for this signal is as follows:

$$LOC(t) = K_1 \cos(3\omega t + \phi) + K_2 \cos(5\omega t) + K_3 \cos(34\omega t)$$

where:

$K_1$ and $K_2$ are the amplitudes for a modulation from 0 to 40% respectively of the 90 Hz and 150 Hz components, $K_1+K_2$ being always equal to 40%, $K_3$ is the amplitude for a 15% modulation of the 1020 Hz signal, and $\omega$ is the phase shift between the 90 Hz and 150 Hz components.

In the case of the GLIDE function, the same LOC(t) signal is used but, in this instance, $K_1$ and $K_2$ are chosen so as to obtain a $K_1+K_2$ modulation factor of 80%, this signal being transmitted in the UHF band included between 328.6 and 335.4 MHz.

To synthesize the LOCALIZER and GLIDE signals in the static mode, the random generator 14 needs simply to be ordered to generate the composite low-frequency signal and to apply it to the amplitude modulation input of the HF generator 11.

To obtain the low-frequency signal in such a way that it is perfectly recurrent and stable, the period of the signal to be generated must be a primary sub-multiple of the 90 Hz and 150 Hz frequencies, i.e. 30 Hz, if one wishes to generate a signal without the 1020 Hz identification component. The sampling frequency will thus be e.g. 10×150 Hz and the necessary number of samples to be calculated will be 1500 Hz divided by 30 Hz, i.e. 50, the amplitude of each of these samples being computed by applying the LOC(t) equation without the identification component.

To synthesize a low-frequency signal including the 1020 Hz identification component, a sampling frequency equal to 10×1020 Hz must be used along with a number of samples equal to 10200 Hz divided by 30 Hz, i.e. 340 samples, each having an amplitude computed with the complete LOC(t) equation.

The waveshapes thus defined can also be preloaded into the memory of the random generator 14.

The interfacing device 3 then merely needs to be commanded to trip the switches C4 and C10 so as to apply the output of the generator 14 to the modulation input of the HF generator 11, and to trip the switch C11 to apply the output of the HF generator 11 to the connector 2, the HF generator being commanded to generate the amplitude modulated carrier wave corresponding to the LOCALIZER or GLIDE function selected.

In the dynamic mode, this involves simulating the signal received by an aircraft approaching the runway during the landing phase, and therefore involves stimulating the low-frequency signal.

For this purpose, three random generators 13 to 15 are used, the respective waveshapes being loaded in their memories beforehand, the generator 14 serving to generate the 150 Hz component, the generator 15 serving to generate the 90 Hz component, and the generator 13 serving to generate a signal modulating the 90 Hz and 150 Hz components.

Thus, the waveshapes preloaded in the three random generators 13 to 15 are obtained by means of the following functions:

$\cos(3\omega t)$ for the generator 14, $\cos(5\omega t)$ for the generator 15, and $U(t)$ with $0<U(t)<U1$ for the generator 13.

The offset voltage 31 supplying the voltage U1 is programmed at 0.4 V for the LOCALIZER signal, and at 0.8 V for the GLIDE signal, so as to obtain modulations $K_1+K_2$ at 40% and 80% respectively.

The output of the generator 13 is applied, by means of the switches C1, C3 and C7, to the amplitude modulation inputs of the generators 14 (source of the 150 Hz) and 15 (source of the 90 Hz), the signal applied to the generator 14 being reversed beforehand by means of the reversing switch 32 and amplitude shifted by the offset voltage 31, in order to obtain a constant sum of the coefficients $K_1$ and $K_2$ of modulation of the 90 Hz and 150 Hz components.

The signals resulting from the generators 14 and 15 are applied to the inputs of the adder 34 by means of the switches C4 and C8, and the output of the adder 34 is applied to the input of the HF generator 11 by means of the switch C10.

Should inclusion of the 1020 Hz identification signal also be required, the generator 13 needs simply to be programmed to obtain a signal having the following equation:

$$U(t)+0.15 \text{ V rms} \cos(34\omega t),$$

the reversing switch 32 also enabling the 1020 Hz component to be filtered so that the identification signal is supplied solely by the generator 15.

The MARKER function is performed by three markers on the ground transmitting signals coded in Morse at different frequencies according to the distance between the aircraft and the runway. The receiver on board the aircraft thus receives a 95% amplitude modulated VHF signal at a frequency of 75 MHz. The modulation frequencies and the accompanying Morse keying are a function of the position of the transmitting marker in relation to the runway threshold.

Thus, the OUTER MARKER transmits a 400 Hz signal keyed by a succession of dashes, the MIDDLE MARKER transmits a 1300 Hz signal keyed by a succession of alternated dots and dashes, and the INNER MARKER transmits a 3000 Hz signal keyed by a succession of dots, bearing in mind that a dash lasts 300 ms, a dot lasts 100 ms and a space also lasts 100 ms.

To synthesize such a signal, it need simply be sampled off to programme the random generator 14, and then applied to the input of the HF generator 11.

Two operating modes can be envisaged: a recurrent mode (permanent periodic signal) and a set duration mode (periodic signal of limited transmission duration).

However, the simulation principle is independent of the operating mode as selection of the latter only depends on the programming parameters of the random generator 14. In fact, the first mode corresponds to a programming of the signal to be generated in the recurrent mode, whereas the second mode uses the counting function of the generator which enables the transmission duration of the signal to be defined (period of the signal by the number of periods).

Synthesis of the signal transmitted by the OUTER MARKER requires recourse to a sampling frequency equal to e.g. 10 times the corresponding frequency of the low-frequency signal, i.e. 4 kHz, and that 1600 samples corresponding to the period of the Morse signal (duration of a dash (300 ms) and a space (100 ms) multiplied by the sampling frequency) be memorized.

In the case of the signal transmitted by the MIDDLE MARKER, a sampling frequency of 13 kHz must be used with 7800 samples corresponding to one period of the Morse signal (duration of one dot, one space, one dash and one space).

Likewise, for the INNER MARKER, the sampling frequency is 30 kHz and the number of samples is 6000.

The amplitude of each sample is calculated by the following relation:

$$0.95 \sin (\omega t)$$

$\omega$ being the pulse corresponding to frequencies of 400, 1300 or 3000 Hz, as the case may be.

DME signals

The DME system enables an aircraft to determine the distance separating it from a marker on the ground. It is based on the measurement of the response time of the signals transmitted by the aircraft and uses the band ranging from 962 to 1213 Hz.

To this end, the aircraft transmits pairs of pulses at a frequency included within the band ranging from 1025 to 1150 MHz, these pulses being received by the marker on the ground and then retransmitted with a transmission frequency difference of 63 MHz.

On board the aircraft, a receiver measures the response time separating the transmission pulses from the response pulses, the distance information being deduced from the response time of the marker on the ground.

This therefore involves synthesizing pairs of pulses which are only transmitted after reception of a signal with a constant lag of 50 µs to which the signal propagation simulation time is added:

Lag=50 µs+2 d/c c being the speed of light and d being the distance between the aircraft and the marker.

Furthermore, a marker identification signal at 1020 Hz is associated with the signal containing the pulses.

The pulses are synthesized by the random generator 15. To this end, it is necessary, in order to define the shape of the wave preloaded in the memory, to use a sampling frequency, e.g. of 2 MHz, compatible with the characteristics of the pulse, i.e. the rise time (2 to 3 µs), the duration of a pulse (3 to 4 µs) and the duration between two pulses (12 µs) of a same pair.

The number of samples to be memorized is deduced from the total duration of a pair of pulses to which must be added the lag (50 µs+2 d/c), divided by the sampling frequency, i.e. for a required distance of 100 km:

737.5 µs/0.5 µs=1475 samples

The signal supplied by the generator 15 is applied to the input of the HF generator 11 by means of the switches C8 and C10 so as to perform a 100% amplitude modulation of the HF signal. The signal at output of the HF generator 11 is transmitted, by means of the switch C11, to the circulator 38 which transmits the signal from the HF generator 11 both to the connector 2 and to the switch C12. The switch C12 applies the signal received to the input of the detector 36. The signal at output of the detector 36 is applied to the triggering input of the random generator 15 via the power divider 37, the threshold detector 39 and the switch C9, so as to trigger, in the generator 15, the transmission of the memorized signal corresponding to the response pulses.

Furthermore, the power divider 37 applies the signal from the detector 36 to an input of the digitizer 21 via the switch C14 in order to enable the pulses received to be observed (measurement of the rise time and duration).

Advantageous use can be made of a low-pass analog filter (not represented in the FIG.) with a cut-off frequency of 500 kHz to smooth off the shape of the wave of the signal at output of the generator 15.

When it is required that the 1020 Hz identification signal be included, the generator 14 needs simply to be programmed accordingly. The signal from the generator 14 is added, by means of the adder 34, to the signal generated by the generator 15.

It should be noted that any other identification signal waveshape can be imagined provided there is a minimum compliance with the Shannon relation for the sampling frequency and that the storage capacity of the random generator used is not exceeded.

In the dynamic mode, the aim is to simulate the signal received by an aircraft approaching a marker. This involves stimulating the low-frequency signal conveying the information. The equipment on board the aircraft receives, as a function of the distance separating the aircraft from the marker on the ground, a more or less retarded pair of pulses. The time lag between the transmission and reception signals enables it to deduce the distance separating it from the marker.

As in the static mode, the random generator 14 will therefore be used to generate the identification signal of the marker, and this can notably be a sinusoidal signal with a frequency of 1020 Hz, the random generator 15 serving to generate the response pulse pair. Furthermore, the generator 13 is used to generate a signal used to phase modulate the signal from the generator 15. This signal varies from −1 to +1 Volt in order to vary the phase of the signal generated by the generator 15 from 0° to 180°, thus simulating the approaching or moving away of the aircraft in relation to the marker.

TACAN signals

The TACAN system is a navigational system capable of simultaneously specifying the magnetic heading,—of which the principle is close to that of the VOR system (the azimuth being obtained on board from a phase measurement),—and the distance, of which the principle is identical to that of the DME system. DME signals, when present, are used to convey the TACAN signals.

The marker on the ground transmits, within the band ranging from 962 to 1213 MHz, a primary reference signal transmitted in phase with the magnetic north, and eight intermediate secondary reference signals spaced 40° apart, enabling the accuracy of the azimuth to be increased. At a same instant, these signals are received identically by all aircraft within radioelectric range of the marker, irrespective of their position.

Onto this reference signal is superposed a signal of variable amplitude depending on the position of the aircraft, enabling it to deduce therefrom its direction in relation to the marker (and therefore in relation to the magnetic north).

At the same instant, these signals are received with a different amplitude according to the position of the aircraft with respect to the marker.

On board the aircraft, a receiver compares the variable signal to the reference signals, which equals determining the angle direction of the aircraft-marker with respect to the magnetic North.

Two types of coding are used (one for the X channels and one for the Y channels). These coding types differ by way of their frequency band and by their transmission mode (ground-to-air or air-air).

However, the principles implemented are independent of the type of coding and can be equally applied to the other modes, to the extent that, in simulation, only the programming parameters of the instruments used differ from one another.

The simulation device must enable the generation of the composite low-frequency signal, which conveys the azimuth and distance information, used to modulate a HF signal.

The aircraft simultaneously receives three types of information:

a reference datum comprised of the primary reference signal and the eight secondary reference signals, the primary reference signal being comprised of a pulse string of 12 pairs of pulses spaced 12 μs apart (in the case of channel X), each secondary reference signal being comprised of a pulse string of six pairs of pulses spaced 24 μs apart (in the case of the X channel), an azimuth datum of frequency identical to the reference signal, i.e. 15 Hz for the primary reference and 135 Hz for the secondary reference, the spaces between the reference pulse strings being filled in by so-called padding pulses, a distance datum which slots in between two reference pulse strings in the place of padding pulses.

The primary reference signal, of frequency equal to the frequency of rotation of the antenna (15 Hz), is transmitted every time the transmission lobe of the antenna is pointed in the direction of the magnetic north. The secondary reference signals are transmitted at regular intervals between two primary reference signals. This technique enables the reference signal to be broken down into nine equidistant segments corresponding to a frequency of occurrence of the reference signals (pulse strings) equal to 9×15 Hz, i.e. 135 Hz. These reference signals are received, by the equipment on board the aircraft, in an identical manner and independently of the position of the latter in relation to the marker.

As seen from the on-board equipment, the azimuth signal reaches a maximum amplitude when the antenna lobe is pointed in the direction of the aircraft. From an electrical point of view, this is the equivalent of a 15 Hz amplitude modulation to which a further 135 Hz amplitude modulation is superposed. It is the phase shift between the reference signals and the 15 Hz and 135 Hz modulation signals that indicates the azimuth.

As for the distance datum, the principle is identical to that of the DME system, i.e. the distance is deduced from the two-way transmission time of the wave transmitted by the aircraft and to which must be added 50 μs intrinsic propagation time inside the marker on the ground. As we are dealing with signals transmitted by the on-board equipment, which are asynchronous in relation to the reference signals, priority must be granted to the latter in order for the equipment to be able to continuously receive the azimuth information. Thus, the distance signals occurring during the transmission duration of a reference pulse string will not be returned by the marker and it is the on-board equipment that identifies and recognizes the pulse type.

The composite low-frequency signal is comprised of a succession of pulse strings of which the amplitude changes at the rhythm of the 15 and 135 Hz signals and which can be of up to a double amplitude modulation.

Thus, the amplitude of the pulses complies with the equation:

$$AMP(t) = K1 + K2 \cos(2\pi 15 t) + K3 \cos(2\pi 135 t)$$

K1 being an offset, K2 and K3 being the respective amplitudes for a modulation factor included between 7 and 30% of the 15 Hz and 135 Hz signals, K1+K3 being the amplitude for a modulation factor included between 15 and 55%, K1 being equal to:

$$1 - (K2 + K3)$$

To synthesize such signals in the static mode, the pulse generator 14 is used with a sampling frequency of 4 MHz and a number of samples corresponding to a complete 15 Hz period, i.e. 266,666 samples. The amplitude of the signal is given by the formula AMP(t+φ)×f(t), where f(t) corresponds to the pulse string over a 15 Hz period.

The random generator 14 must be programmed to also supply, at its triggering output TRIG OUT, a signal enabling delimitation of the moments corresponding to dead time. This signal is used by the analog multiplexer 35 to authorize transmission of DME pulses only during the interval of time between two reference pulse strings.

The random generator 15 is also used with programming identical to that used for the generation of DME signals, i.e. a sampling frequency of 2 MHz, and a number of samples which also takes into account the need to generate an additional pulse indicating to the analog multiplexer 35 that a reply must be provided to a DME query, giving a total of 1475 samples for a distance of 100 km.

The resultant signal is obtained by combining, by means of the adder 34, the signals from the random generators 14 and 15. The DME type pulses transmitted in response to the distance pulses replace the padding pulses, and the amplitudes of these pulses must comply with the AMP(t) formula set forth hereinabove. To this end, the envelop detector 33 filters the pulses of the signal generated by the generator 14 so as to only restore the signal of the pulse amplitude envelope. This signal is applied to the amplitude modulation input of the random generator 15 in order for the amplitude of the DME pulses to be consistent, at a given moment in time, with the envelope of the signal at 15 Hz and 135 Hz. The analog multiplexer 35 also enables these pulses to pass during dead times between two reference pulse strings.

It should be noted that the analog multiplexer 35 and the adder 34 must perform a particular function to replace a pair of padding pulses by a pair of DME response pulses. To this end, the pair of response pulses supplied by the generator 15 must be preceded by an enabling pulse indicating to the control logic 51 that it must replace the padding pulse pair by the DME response pulse pair coming from the random generator 15, via the switch C8.

The control logic 51 is generally programmed to detect the envelope interval of time of the padding pulse pairs and DME response pulse pairs supplied by the generator 15, by means of the hysteresis detectors 52,53, and to authorize the transmission of the DME pulses and TACAN pulses by means of the signal adapters 54,55. The role of the adder 34 is to combine the output signals of the generators 14 and 15 at the rhythm of the control signals coming from the control logic 51 and applied to the control input of the signal adapters 54,55.

If a lag of 50 μs is used, which corresponds to a DME distance of zero, the signal at the output TRIG OUT of the generator 14 delimits the moment at which the DME pulses can be transmitted. This signal can be programmed to be activated e.g. subsequent to the last pair of pulses of a reference string, and to be deactivated at the falling edge of the last padding pulse.

The occurrence of the enabling pulse invalidates the signal adapter 54 and validates the signal adapter 55, which enables the padding pulse pair following the enabling pulse to be replaced by the DME pulse pair specifying the distance between the aircraft and the marker on the ground. The occurrence of the last edge of the DME pulse pair invalidates the signal adapter 55, whereas the occurrence of the last edge of the padding pulse pair validates the output of the signal adapter 54.

As with the DME signals, the signal at output of the HF generator 11 is applied, by means of the switch C11 and the circulator 38, to the transmission/reception channel of the connector 2. The signal received (DME query) is applied, via the reception channel of the circulator 38, both to the triggering input of the generator 15, so as to trigger transmission by the latter of the memorized signal corresponding to the response pulse, and to the input of the digitizer 21 so as to enable observation of the pulses received.

In the dynamic mode, the solution set forth can stimulate either the DME signal or the azimuth signal of the TACAN system.

Should stimulation of the DME signal be required for the simulation of the signal received by an aircraft approaching a marker, this will involve stimulating the low-frequency signal conveying the distance information, the azimuth signal being generated in the static mode.

The generator 15 is then used to generate the pair of response pulses, the generator 14 serves to generate the azimuth signal under the same conditions as in the static mode, and the generator 13 is used to generate a signal serving to phase modulate the signal supplied by the generator 15.

The programming of the sampling frequency and amplitudes of the low-frequency signals of the random generators 14 and 15 is identical to the programming used in the static mode. Furthermore, the phase of the signal supplied by the generator 15 is proportional to the voltage applied to its phase modulation input and can vary from 0° to 180° to simulate the approaching or moving away of the aircraft in relation to the marker.

When stimulation of the azimuth signal is required in order to simulate the approaching of a marker, the distance signal is eliminated and the pulse pairs conveying the azimuth information are made circulate at the rhythm of a 15 Hz signal onto which a 135 Hz signal is superposed. The phase between this signal and the reference pulse pairs enables an azimuth position to be determined in relation to the marker.

To this end, the generator 15 is used to generate the signal combining the 15 Hz and 135 Hz signals, the generator 14 serves to generate a reference signal comprised of reference and padding pulse pairs in the same conditions as in the static mode, the output amplitude being modulated by the signal supplied by the generator 15, and the generator 13 is used to generate a signal used to phase modulate the signal coming from the generator 15.

The sampling frequencies and the amplitudes of the samples used by the random generators 13,14,15 are computed in accordance with the same rules as in the static mode. Furthermore, the phase of the signal at output of the generator 15 is proportional to the voltage applied to its phase modulation input and can vary from 0° to 180° in order to simulate the azimuth developments of the aircraft in relation to the marker.

When the DME distance signal or the azimuth signal is stimulated, the radio navigation interface 3 ensures the wrapping around of the generators as set forth hereinabove, and transmits the resultant low-frequency signal to the amplitude modulation input of the HF generator 11 which supplies, as a function of the programming parameters, the amplitude modulated high-frequency signal which is applied to the transmission/reception channel of the connector 2 via the circulator 38. The signals received at the connector 2 via the reception channel of the circulator 38 and transmitted to the detector 36 can thus be analyzed e.g. by means of the digitizer 21.

IFF signals

The IFF system enables an aircraft to be identified. It consists of an identification process which is based on the question and answer principle and is initialized by a transponder on the ground generating an interrogation message transmitted by modulation of a 1030 MHz carrier wave via a shaped-beam antenna endowed with rotational motion.

In response, the aircraft transmits an identification message on a 1090 MHz carrier wave.

In addition, by way of the radiation characteristics of the antenna (good azimuthal directivity and broad on-site beam), the interrogation message enables the aircraft to identify its azimuth and the distance separating it from the marker, the azimuth being deduced from the instant of response in relation to the angular position of the antenna, and the distance, as with the DME function, is deduced from the measurement of the amount of time needed for the two-way transmission to exchange the signals.

The interrogation signals will thus be simulated and the identification message will be acquired and decoded.

As the azimuth and distance data come within the scope of the system on the ground, only the signals seen by the on-board equipment will be simulated and acquired.

The interrogation signals are comprised of a pair of pulses P1 and P3 of which the spacing apart depends on the interrogation mode, and a pulse P2 situated between P1 and P3.

In fact, the main lobe of the antenna is accompanied by secondary lobes which translate, for the on-board equipment, into multiple echoes that interfere with the identification system. In this context, in order to improve the system, the pulse P2 is transmitted 2 µs after the pulse P1 by an omnidirectional antenna with higher power than that of the secondary lobes, while remaining lower than that of the main lobe.

There are eight standardized interrogation modes which differ from one another by way of the space (from 3 to 25 µs) between the pulses P1 and P3.

As regards the identification signal, this is a hyperfrequency signal modulated by pulses spaced 1.45 µs apart, the identification message being coded into 12 serially transmitted bits with 4096 possible combinations. It is framed by two framing pulses F1 and F2 spaced 20.3 µs apart and ended by a pulse SPI situated 4.35 µs away from the pulse F2.

The interrogation and response signals are normally separated by a time t which is deduced from the following formula:

$$t=2\ d/c+3\ \mu s \pm 0.5\ \mu s$$

d being the distance separating the aircraft from the marker, and c being the speed of light.

As we are dealing with the monitoring of on-board equipment, a distance of zero will be selected. Therefore, the identification signal will be transmitted by the equipment undergoing the test 3 μs±0.5 μs after the rising edge of the pulse P3 of the interrogation signal.

To this end, the random generator 14 is used to generate the interrogation signal, in which the waveshape of each pulse P1,P2,P3 has been preloaded in the memory, these pulses being transmitted via the radio navigation interface 3 to the amplitude modulation input of the HF generator 11, the modulated signal obtained at output being applied to the input of the circulator 38 which enables the interrogation signals to be separated from the identification signals transmitted in response.

The sampling frequency to be used by the generator 14 must be compatible with the waveshapes to be generated, and is deduced from the minimum rise time of the interrogation pulses, i.e. 50 ns, which corresponds to 20 MHz. The number of samples to be memorized corresponds to a duration equal to the distance between pulses P1 and P3, i.e. 8.1 μus (mode A), to which must be added the rise time of P1 (0.1 μs), the fall time of P2 (0.2 μs) and the duration of P3 (0.9 μs), i.e. a total of 9.3 μs. The number of samples to be memorized is therefore equal to 9.3 μs / 50 ns, i.e. 186 samples.

The amplitude of each sample is deduced from the waveshape of the interrogation signal according to the amplitude desired for each pulse.

The HF generator must be programmed to generate a 1030 MHz carrier wave which is amplitude modulated by the signal supplied by the generator 14.

The response signal is acquired by the digitizer 21, the response signal being separated from the interrogation signal by the circulator 38, and transmitted to the digitizer 21 after demodulation by the detector 36.

The signal digitized by the digitizer 21 is then transmitted to the test computer 1 which, after processing, decodes the message received for analysis.

To this end, the digitizer is programmed to trigger the acquisition of the signal at its first input. Contrary to the random generator, the digitizer enables a signal to be acquired and digitized at the rhythm of a sampling frequency defined by the programming parameters. This frequency must be computed to enable at least the acquisition of one sample at each bit constituting the response message, i.e. at least 1/1.45 μs=689.655 kHz, which corresponds to the transmission frequency of the message.

Under these conditions, only 17 samples need be memorized. The high storage capacity of current digitizers is put to advantage to memorize several consecutive response messages.

Analysis of the signals

The radio navigation interfacing device 3 also enables detailed analysis to be performed on the signals coming from radio navigation instruments being tested. To this end, the signal to be analyzed is applied to the connector 2 on the transmission/reception channel of the circulator 38 which transfers it to the switch C12. The switch C12 then orients this signal in the direction of the envelope detector 36 which demodulates it so as to recover the low-frequency signal modulating the carrier wave. The demodulated signal is applied to the input of the switching device 25 via the power divider 37. The switching device 25 then enables the demodulated signal to be analyzed to be directed to the digitizer 21. Should analysis of the complete signal (non-demodulated) be required, the switch C12 needs simply to be tripped for the signal to be applied directly to the switching device 25 which then orients the signal towards the spectrum analyzer 23, frequency meter 22 or milliwattmeter 24.

Thus, the digitizer 21 enables a signal to be acquired and memorized for the purposes of processing by the computer 1.

The spectrum analyzer 23 is used to measure the power of signals of continuous waveshape, frequencies, and the power spectrum in the frequency range.

It also enables frequency translations to be carried out at its auxiliary output OUT, these translations enabling time measurements to be taken by means of the digitizer 21. This arrangement has the advantage of authorizing measurements on HF signals of frequency in excess of the passband of the digitizer 21.

The milliwattmeter 24 is used to measure powers on signals of continuous waveshape as well as on pulse signals with the possibility of selecting the pulse to be analyzed within a frame.

The frequency meter is used to measure frequencies of signals of continuous waveshape, as well as of pulse signals modulated by a HF signal with the possibility of selecting a pulse within a frame, and to measure pulse widths of a pulse signal modulated by a HF signal.

The description above shows that, with a device of relatively simple design, it is possible to generate and analyze complex signals such as those used in radio navigation.

The structure of this device can, of course, be modified to generate other types of signals, without departing from the concept of the invention as it has been described above.

We claim:

1. In an automatic testing system comprising a computer driving measuring and generating devices for measuring and generating electric signals, said generating devices being of standard type and each comprising a control interface to be controlled by said computer for respectively generating signals of predetermined shapes, a signal combining device for testing any type of radio navigation equipment using radio navigation signals formed by composite low-frequency signals of complex shape which modulate a high-frequency carrier wave, said signal combining device comprising:

first connection means connected to inputs and outputs of said generating devices and to a radio navigation equipment under test, first switching means for selecting outputs of said generating devices, in order to select low-frequency signals and a high frequency wave, combining means for combining with one another signals produced at the selected outputs of said generating devices, in order to combine said low-frequency signals so as to produce a low-frequency signal of complex shape and to modulate said high frequency wave with said low-frequency signal of complex shape, selecting means for applying said high frequency wave modulated by said low-frequency signal of complex shape to a selected input of said radio navigation equipment under test, and a control interface controlled by said computer for controlling said switching means, said selecting means and said combining means.

2. The signal combining device as claimed in claim 1, wherein said measuring devices are of standard type and each comprising a control interface to be controlled by said computer for respectively measuring and analyzing signals produced by said radio navigation equipment under test, said device further comprising:

second connection means connected to inputs of said measuring devices and outputs of said radio navigation equipment to be tested, and second switching means for selecting inputs of said measuring devices to which applying signals outputted by said equipment under test, said second switching means being controlled by said control interface.

3. The signal combining device as claimed in claim 1, wherein said computer comprises means for performing a test sequence defined by a sequence of high-level instructions, means for translating each high-level instruction into a series of elementary commands specific to one of said measuring and generating devices or said signal combining device, and means for transmitting each elementary command to the relevant device.

4. The signal combining device as claimed in claim 1, further comprising means for demodulating a radio navigation signal with a view to analysis thereof by means of said measuring devices.

5. The signal combining device as claimed in claim 1, wherein said generating devices comprise random generators to generate primary low-frequency signals of predetermined waveshape.

6. The signal combining device as claimed in claim 1, wherein said combining means comprise a means for applying a first primary signal generated by a first signal generating device to an input of a second signal generating device in order to phase and amplitude modulate a second primary signal generated by said second signal generating device, thus producing a composite low-frequency signal.

7. The signal combining device as claimed in claim 1, further comprising a means for synchronizing a low-frequency signal generating device by means of the composite low-frequency signal obtained by demodulation of the radio navigation signal generated.

8. The signal combining device as claimed in claim 1, wherein said first switching means comprise means for enabling each of said generating devices to be used separately.

9. The signal combining device as claimed in claim 1, wherein said combining means comprise means for combining with one another signals coming from said signal generating devices.

10. The signal combining device as claimed in claim 1, further comprising an adder for adding to one another two primary low-frequency signals generated respectively by two signal generating devices connected to said signal combining device.

11. The signal combining device as claimed in claim 1, further comprising a demodulator for separating the composite low-frequency signal from the high-frequency carrier wave.

12. The signal combining device as claimed in claim 1, connected via busses, as is said signal measuring and generating devices, to said computer designed to control said device and said device.

13. The signal combining device as claimed in claim 1, connected to three random generators enabling a composite low-frequency signal to be generated, and to a high-frequency generator with a large amplitude modulation band enabling the generation of a carrier wave which is modulated by the composite low-frequency signal.

14. The signal combining device as claimed in claim 1, further comprising a circulator for separating a signal produced by the device and applied to a channel of said equipment under test, from a response signal coming from that same channel, with a view to analysis thereof by said measuring devices.

* * * * *